US006864144B2

(12) United States Patent
Kenyon et al.

(10) Patent No.: US 6,864,144 B2
(45) Date of Patent: Mar. 8, 2005

(54) METHOD OF STABILIZING RESIST MATERIAL THROUGH ION IMPLANTATION

(75) Inventors: Christopher Kenyon, Portland, OR (US); Michael R. Fahy, Portland, OR (US); Gerard T. Zietz, Banks, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/158,980

(22) Filed: May 30, 2002

(65) Prior Publication Data

US 2003/0222345 A1 Dec. 4, 2003

(51) Int. Cl.⁷ ............................................. H01L 21/336
(52) U.S. Cl. ...................... 438/302; 438/369; 438/373; 438/506; 438/546

(58) Field of Search ................................ 438/302, 369, 438/373, 423, 506, 514, 546

(56) References Cited

U.S. PATENT DOCUMENTS 6,462,817 B1 * 10/2002 Strocchia-Rivera ......... 356/369
2002/0013055 A1 * 1/2002 Yamaguchi et al. ........ 438/689

* cited by examiner

Primary Examiner—Dung A. Le
(74) Attorney, Agent, or Firm—John F. Travis

(57) ABSTRACT

A resist material used to mask an underlying layer during an etch process is subjected to ion implantation to harden the resist material against damage from the etch process. In a particular embodiment, the resist material is compatible with exposure to 193 nm radiation for patterning the resist material.

10 Claims, 4 Drawing Sheets

METHOD OF STABILIZING RESIST MATERIAL THROUGH ION IMPLANTATION

BACKGROUND

1. Technical Field

An embodiment of the invention relates generally to the fabrication of integrated circuits, and in particular relates to the processing of a resist layer in the fabrication of integrated circuits.

2. Description of the Related Art

Resist layers (sometimes called photoresist layers to imply the lithographic processes typically used with them) are frequently used to generate masks during the fabrication of integrated circuits. A layer of resist material is deposited on the surface of an underlying layer to be patterned. The layer of resist material is then exposed to light in a specific pattern, and processed in a way that removes the exposed portions of the resist material (or alternately removes the non-exposed portions) so that the remaining resist material forms a mask in the shape of the exposure pattern. The areas of underlying material that are not directly covered by the mask are then removed through an etch process, such as a plasma etch, with the mask of resist material preventing removal of those portions of the underlying material that are directly under the resist material. The mask of resist material is then removed through another process, leaving only those portions of the underlying layer that form the shape of the original pattern.

Because an etch is a destructive process, the etch may also cause deterioration of the resist material. This deterioration may uncover additional portions of the underlying material before the etch is complete, thereby etching portions of the underlying material that were intended to be protected from the etch process. The deterioration is typically greatest at the edges of the resist material, so that small-geometry elements such as transistor gates may be significantly reduced in size when the edges of the resist pattern that creates those elements are unintentionally etched away. Regardless of geometry, resist material designed for exposure light with a wavelength of approximately 193 nanometers (nm) is particularly susceptible to deterioration during the plasma etch.

Resist material may be hardened against this deterioration by curing the resist material with an electron beam before the plasma etch process. However, electron beam tools are generally expensive and too slow for high volume manufacturing, and are not available in many integrated circuit fabrication facilities.

BRIEF DESCRIPTION OF THE DRAWINGS

The invention may be understood by referring to the following description and accompanying drawings that are used to illustrate embodiments of the invention. In the drawings.

DETAILED DESCRIPTION

Figure 1A:
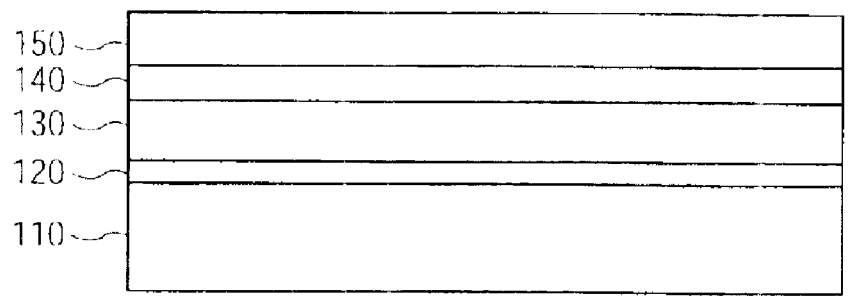
FIGS. 1A through 1G show cross-sectional views of certain material layers at various stages in a fabrication process, according to one embodiment of the invention.

In the following description, numerous specific details are set forth. However, it is understood that embodiments of the invention may be practiced without these specific details. In other instances, well-known circuits, elements and techniques have not been shown in detail in order not to obscure an understanding of this description.

References to "one embodiment", "an embodiment", "example embodiment", "various embodiments", etc., indicate that the embodiment(s) of the invention so described may include a particular feature, element, or characteristic, but not every embodiment necessarily includes the particular feature, element, or characteristic. Further, repeated use of the phrase "in one embodiment" does not necessarily refer to the same embodiment, although it may.

In various embodiments of the invention, ion implantation is used to harden resist material against damage during a subsequent etch process that is used to selectively etch portions of a layer of material underlying the resist material. Ion implantation equipment is common in most integrated circuit manufacturing facilities, and therefore may not represent an additional investment in fabrication equipment. As used herein, the term "harden" is used to mean changing the characteristics of the resist material so that the resist material is more resistant to the etching effects of the subsequent etch process, but the term does not imply anything about the structural mechanical strength of the resist material.

FIGS. 1A through 1G show cross-sectional views of certain material layers at various stages in a fabrication process, according to one embodiment of the invention. Although only two physical features are shown being fabricated, it is understood that many physical features may be fabricated essentially simultaneously in the same layers. The illustrated embodiment shows a structure comprising a substrate 110, a dielectric layer 120, a target layer 130, a hard mask layer 140, and a resist layer 150. Although the terms "substrate", "dielectric", "target", "hard mask", and "resist" are used herein, other terms may be used to describe the affected layers without departing from the intended scope of various embodiments of the invention. As used herein, the terms "above" and "below" refer to the orientation shown in the figures. The physical orientation (with respect to gravity) of an integrated circuit structure during fabrication may be different. The term "structure", as used herein, refers collectively to the substrate and all existing layers at the indicated stage in the fabrication process, and to the physical elements in those layers that are being processed together. It is understood that FIGS. 1A–1G are not drawn to scale, and the relative dimensions of the physical structure should not be inferred from the relative dimensions shown in the drawings.

Substrate 110 may be the basic wafer material on which all the subsequent layers are formed, and in some embodiments is formed of mono-crystalline silicon. While in one embodiment dielectric layer 120 is a thin layer to provide dielectric isolation between the substrate and subsequently-formed features in layer 130, in another embodiment dielectric layer 120 may be omitted. Target layer 130 is labeled herein as a target layer because it is the layer of material that is to be etched into a specified pattern through the processes described, and is thus the "target" of the etch processes. In one embodiment target layer 130 is also the substrate, and layers 110, 120 may be omitted.

Hard mask layer 140 may be used to provide a mask so that etching of target layer 130 will take place only in selected areas, and resist layer 150 may be used to provide a mask for etching hard mask layer 140 in a specified pattern. While in one embodiment the material of resist layer 150 is patterned through photolithographic techniques to provide a mask in the resist layer 150, other embodiments may use other techniques to pattern the resist layer 150. In some embodiments the material of resist layer 150 and the associated processes used on it are not compatible with the material and associated processes of target layer 130, so hard mask 140 is used to provide an intermediate mask with associated processes that are compatible with both resist layer 150 and target layer 130. In an embodiment in which the material and processes of resist layer 150 are sufficiently compatible with the material and processes of target layer 130, hard mask layer 140 and the associated processes used on hard mask layer 140 may be omitted.

In a particular embodiment, target layer 130 comprises polycrystalline silicon and hard mask layer 140 comprises silicon oxynitride, but other embodiments may use layers of other materials and different numbers of layers. For example, in one embodiment used for shallow trench isolation, target layer 130 comprises silicon and hard mask layer 140 comprises silicon nitride, while in another embodiment used for contact patterning, hard mask layer 140 is omitted while resist layer 150 is directly over a target layer 130 of silicon oxide. Other embodiments using other materials in the various layers may also be used.

In some embodiments, resist layer 150 includes material selected for lithographic exposure to light in the deep ultraviolet range (e.g., with a wavelength of less than approximately 200 nm). In a particular embodiment, resist layer 150 comprises an acrylic polymer (e.g., at least one of acrylate, methacrylate, acrylate with a methyl group on backbone, acrylate-methacrylate copolymers, etc.), but other embodiments may use other materials.

Figure 1B:
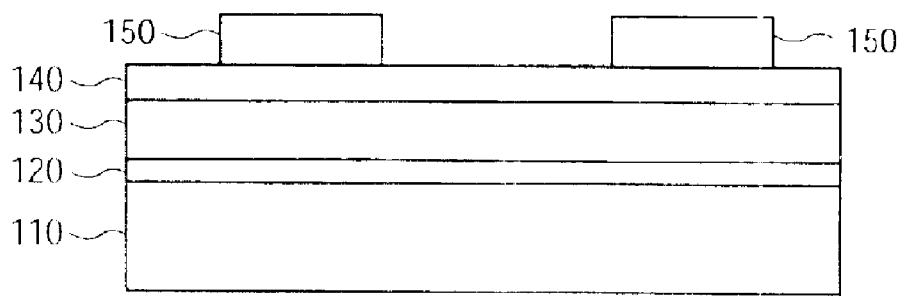
Figure 1C:
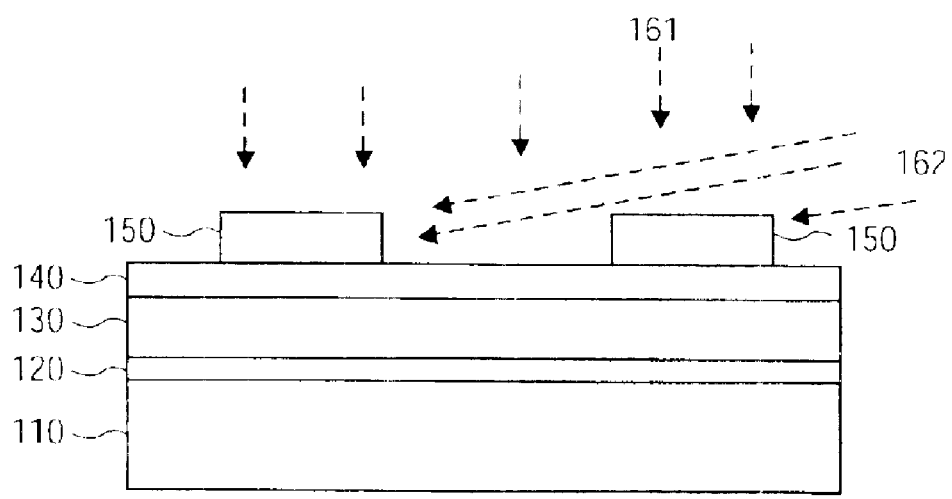
Figure 1D:
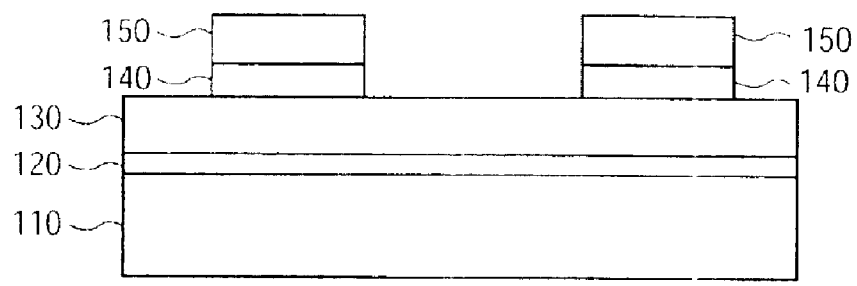
Figure 1E:
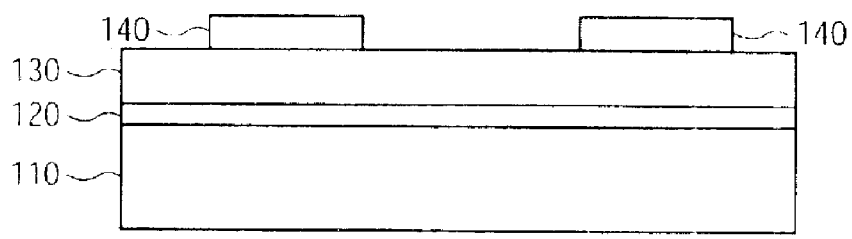
Figure 1F:
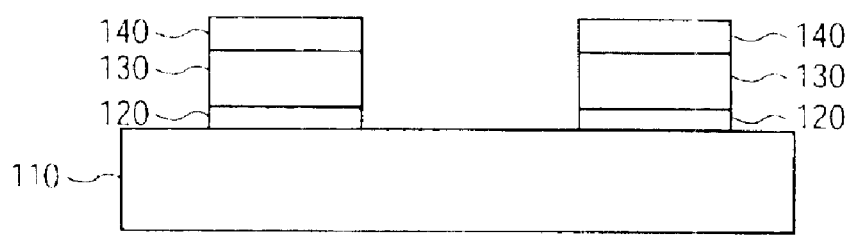
Figure 1G:
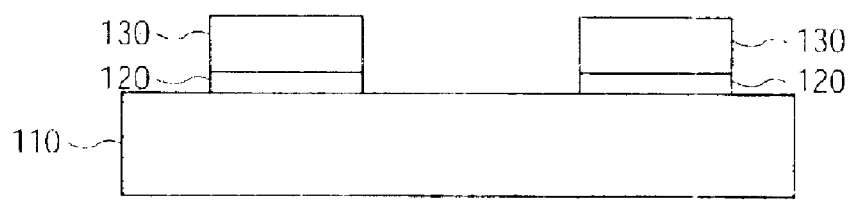
Figure 2:
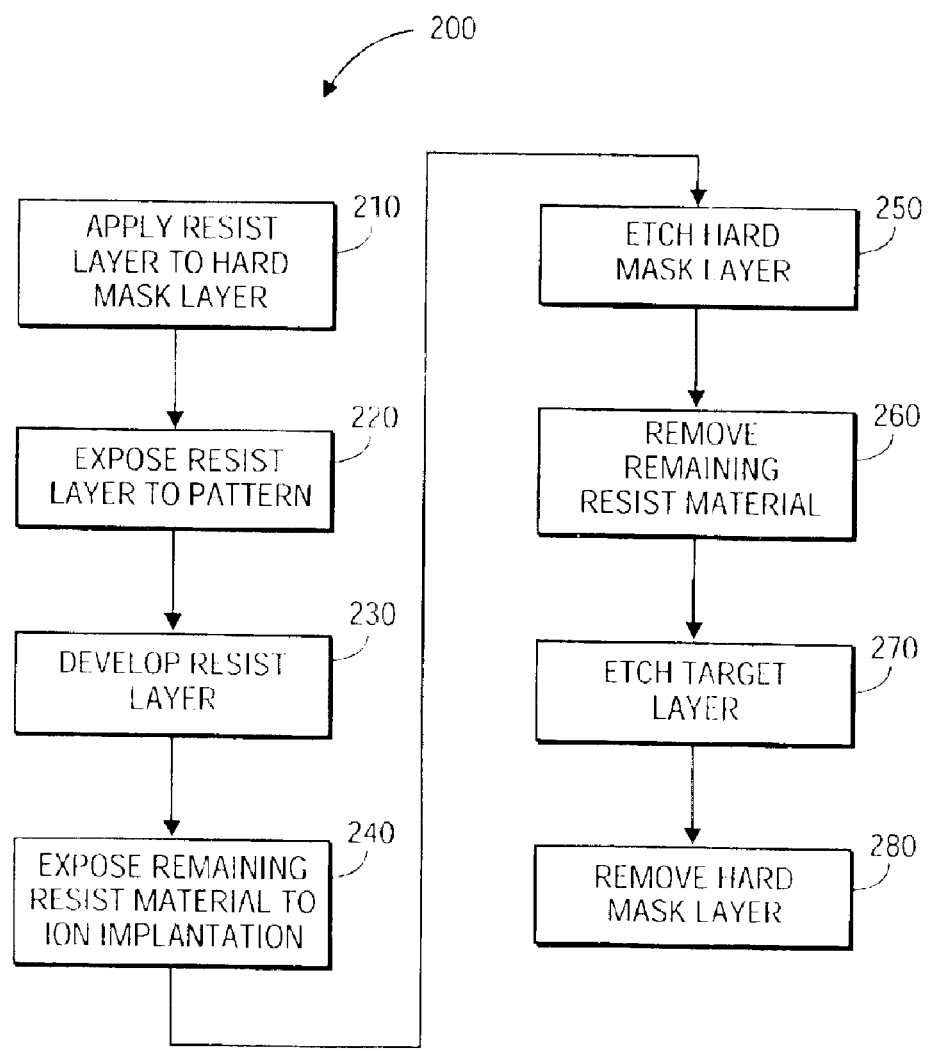
FIG. 2 shows a flow chart of a fabrication process, according to one embodiment of the invention.

FIG. 2 shows a flow chart of a fabrication process, according to one embodiment of the invention. In the following text, FIGS. 1A–G and FIG. 2 are sometimes described with reference to each other. However, it is understood that the structures in FIGS. 1A–G may be produced with processes different than that of FIG. 2, and the process of FIG. 2 may produce structures other than shown in FIGS. 1A–G.

With reference to flow chart 200 of FIG. 2, a resist layer is applied to a hard mask layer at block 210. Application of the resist layer may take various forms in various embodiments, but in a particular embodiment, application of the resist layer includes: 1) heating the structure at 200 degrees Celsius (° C.) for 15 to 20 minutes, 2) spreading the resist material on the surface of the structure, 3) spinning the structure at 5,000 rpm for 25 second to thin the resist material to a thickness of about 1.3 microns, and 4) heating the structure at 115° C. for about 2 minutes to bake the resist material.

FIG. 1-A shows resist layer 150 after it has been applied to hard mask layer 140. While in the illustrated embodiment of FIG. 1A hard mask layer 140 is directly above and in contact with target layer 130, other embodiments may include other layers between hard mask layer 140 and target layer 130, with the desired mask pattern being transferred through the other layers in the form of intermediate masks. In some embodiments, target layer 130 may be considered a "gate" layer in which the gates of various transistors are formed. In many integrated circuits, transistor gates generally have the smallest geometries and therefore may be most likely to benefit from the techniques described herein, but some embodiments of the invention are not limited to gate layers.

At block 220 of FIG. 2, the resist layer is exposed to a pattern of light to change the characteristics of the portions of the resist material exposed to light. Various embodiments may use various exposure energies to accomplish this change, depending on the characteristics of the resist material, but in a particular embodiment the total exposure energy (e.g., radiation intensity×exposure time) is approximately 105 mJ/cm$^2$.

At block 230, the resist layer is developed to remove portions of the resist layer in the same pattern as the exposure. Development of the resist layer may take various forms in various embodiments, but in a particular embodiment, development includes: 1) immersing the structure in a solution of developer and water, 2) mildly agitating the structure, 3) rinsing the structure in deionized water for about 1 minute, and 4) spinning the structure until dry.

In one embodiment, standard lithographic techniques are used in blocks 220 and 230, but other embodiments may use non-standard or yet-to-be-developed techniques.

FIG. 1B shows the structure of FIG. 1A after the expose-and-develop operations have been performed. While in one embodiment (using positive photoresist) the portions of resist layer 150 that were exposed to light are removed in the development operation, in an alternate embodiment (using negative photoresist) the portions of resist layer 150 that were not exposed to light are removed in the development operation. FIG. 1B shows two areas of resist layer 150 remaining, but it is understood that any feasible number of such areas, in various sizes and shapes, may be created concurrently with a single exposure operation and a single development operation.

At block 240 of FIG. 2, the remaining resist material is subjected to ion implantation by bombarding the structure with ions. This is also shown in FIG. 1C, with the dashed arrows representing a flow of ions into the resist material. Depending on the specific application, the ion implantation may use various ion specimens, energies, and doses (where "dose" indicates the number of ions per unit volume implanted in the resist material). In one embodiment silicon ions are used. In a particular embodiment silicon tetrafluoride (SiF$_4$) is a source gas used to produce the silicon ions. In another embodiment fluorine ions are used. In a particular embodiment boron trifluoride (BF$_3$) is the source gas used to produce the fluorine ions. Other embodiments may use other ion specimens, produced from other compounds. While in one embodiment an energy of between about 10–25 kilo-electron volts (kev) is used, other embodiments may use energies outside this range. In a particular embodiment, an energy of about 17 kev is used. While in one embodiment a dose within a range of between about $5 \times 10^{14}$ and $2 \times 10^{15}$ ions per cubic centimeter (ions/cm$^3$) is used, other embodiments may use doses outside this range. In a particular embodiment, a dose of about $1 \times 10^{15}$ ions/cm$^3$ is used.

Depending on the specific application, the ion implantation may be performed at various angles to the structure. As shown in FIG. 1, while an ion stream 161 is directed to the structure at a substantially perpendicular angle (e.g., substantially perpendicular to the plane of any of the layers 120–150), another ion stream 162 may be directed to the structure at a substantially non-perpendicular angle. In a particular embodiment, ion streams are directed to the structure from a substantially perpendicular angle and also from multiple sides of the structure at angles that are substantially non-perpendicular (e.g., at an angle of 15–20 degrees from the plane of layer 140). Such angular ion implantation permits the sides of the remaining resist material to be implanted directly, without having to generate sufficiently high energy levels to penetrate all the way from the top to the bottom of the resist material. Depending on the materials and dimensions involved, such high levels of energy might damage the underlying layers 140 and/or 130. While in one embodiment the different angles are achieved by successively placing the entire semiconductor structure in different orientations with respect to an ion source, and directing an ion stream towards the structure in each orientation, alternate embodiments use other techniques (e.g., the ion source is placed in different positions while the structure remains stationary, both the structure and the ion source are moved to achieve the different orientations, multiple sources are used, etc.)

In a particular embodiment, which may be implemented in combination with any of those just described, five orientations are used to achieve ion implantation of all affected surfaces of the resist material: 1) a substantially perpendicular orientation to implant the top surfaces of the resist material, 2) a substantially non-perpendicular orientation to achieve ion implantation on the edges of the resist material facing toward the ion source, 3) three additional substantially non-perpendicular orientations at angles of approximately 90, 180, and 270 degrees from the orientation of 2), as measured in the plane of the layers. In this manner, the top and all four sides of a rectangular pattern in the resist material may receive direct ion implantation, thus hardening all exposed surfaces of the resist material by approximately the same amount. In an embodiment in which the geometries of the pattern in the resist material are not substantially rectangular, the quantity and placement of the substantially non-perpendicular orientations may vary from those just described to achieve near-uniform levels of ion implantation on all sides of the resist material. In another embodiment, the four discrete positions of operations 2) and 3) above may be replaced by continuously rotating the structure within the plane of the layers while directing a continuous ion stream from a substantially non-perpendicular orientation. In embodiments in which the geometries and angles involved could cause substantially non-uniform ion implantation on different parts of the resist material different exposure times and/or intensities may be used at different orientations to improve the uniformity of implantation.

While in one embodiment the entire surface of the structure is exposed to ion bombardment, it is understood that current or future-developed techniques may be used to substantially limit the ion stream to selected areas of the structure.

At block 250 of FIG. 2, the hard mask layer is etched to remove those portions of the hard mask layer that are not beneath the remaining material of the resist layer. This operation substantially transfers the pattern of resist layer 150 in FIG. 1B into the hard mask layer 140 of FIG. 1D. As used herein, the term 'etch' refers to any process used to remove selected portions of a material, including one or more of: chemical reaction, particle bombardment, plasma reaction, etc. In one embodiment, a plasma etch using fluoro-carbon oxygen is used, but other embodiments may use other techniques and other chemicals. Due to the ion implantation of block 240, the exposed surfaces of resist layer 150 experience increased resistance to deterioration by the etch process of block 250, as compared with the same resist layer without ion implantation.

At block 260, the remaining material in the resist layer is removed. Removal of the remaining resist material may take various forms in various embodiments, but in one embodiment the resist material is removed by exposing the structure to a flow of ionized oxygen at a flow rate of approximately 12 cc/min. at a pressure of approximately 380 mTorr for a time of approximately 5 minutes. Other embodiments may use other techniques (e.g., other times, pressures, flow rates, gases, etc.)

FIG. 1E shows the structure after removal of the remaining resist material. In the illustrated structure, the pattern etched into hard mask layer 140 is a substantially accurate reproduction of the pattern that was placed into resist layer 150 in FIG. 1B.

At block 270, another process is used to produce the structure shown in FIG. 1F, by etching those portions of the target layer and the dielectric layer that are not beneath the remaining portions of the hard mask layer.

At block 280, another process is used to remove the remaining portions of the hard mask layer, thus exposing the final pattern in the target layer. FIG. 1G shows the results. In one embodiment, removal of hard mask layer 140 is achieved through a process that selectively etches hard mask layer 140 without significant damage to target layer 130 or dielectric layer 120, but other techniques may also be used to remove hard mask layer 140 without removing or significantly damaging target layer 130. Depending on the subsequent fabrication operations to be performed, the operation of block 280 may be deferred, leaving layer 140 intact to protect layer 130 from some of the subsequent fabrication operations.

Figure 3:
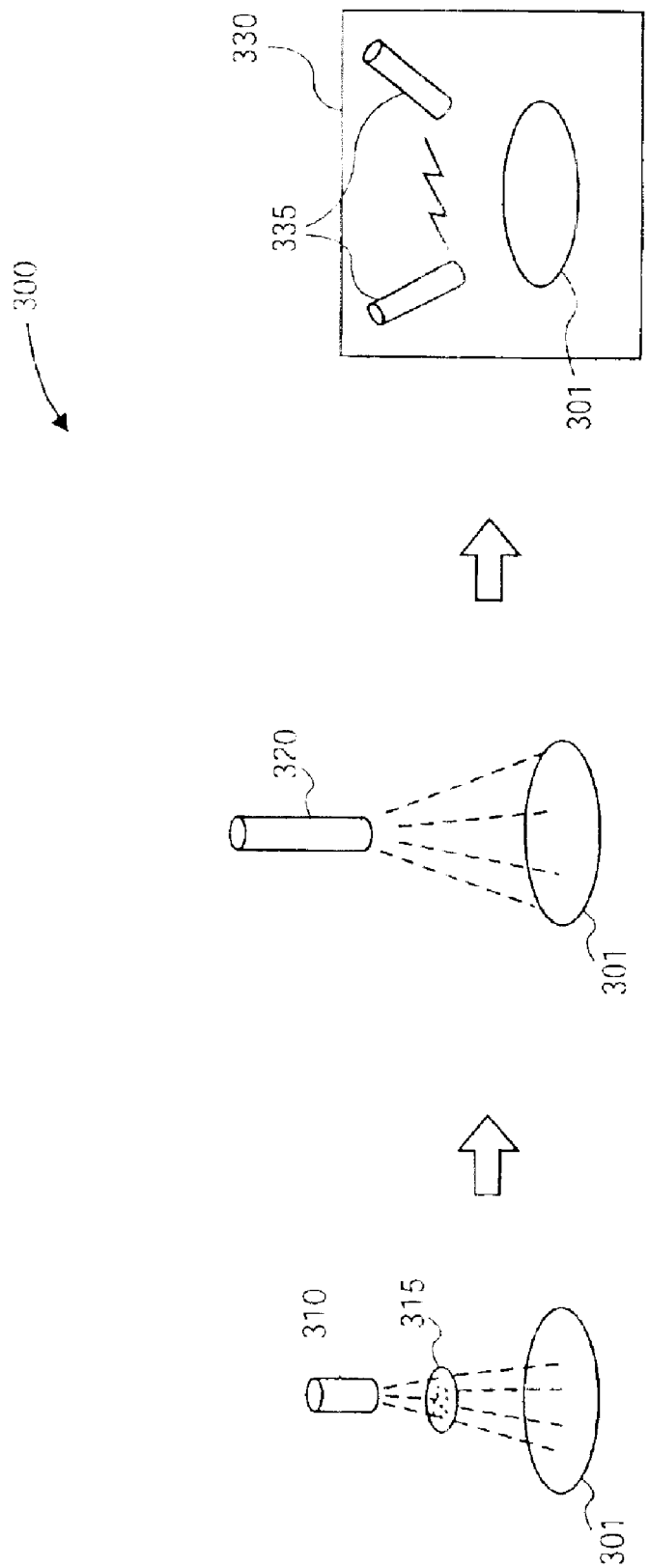
FIG. 3 shows a system used in a fabrication process, according to one embodiment of the invention.

FIG. 3 shows a system used in a fabrication process, according to one embodiment of the invention. The illustrated embodiment of system 300 includes a photolithographic device 310, an ion source 320, and a processing chamber 330, each to operate on a wafer 301 that has a surface with a resist layer covering an underlying layer. The wafer 301 may be physically moved between objects 310, 320, and 330, either manually or through automated means, to perform the operations associated with each object. Objects 310, 320, and 330 are shown as separate pieces of equipment, but in various embodiments one or more of these objects may be combined into a single piece of equipment. Additional equipment not shown may also be used to facilitate the operations described.

In one embodiment, photolithographic device 310 exposes a layer of resist material on the surface of wafer 301 with electromagnetic radiation (e.g. deep ultraviolet light) through a transmissive photographic mask 315. In one embodiment, the mask has a particular pattern of transparent and opaque (to the wavelength of radiation used) areas in the shape of the pattern that is to be imparted onto a target layer on the wafer 301. In another embodiment (not shown) a reflective mask is used rather than a transmissive mask, with reflective and non-reflective areas forming the pattern. In some embodiments, an optical reduction system (not shown) is used so that the pattern exposed on the wafer is a fraction of the size of the photographic mask 315. In some embodiments, the photographic mask 315 contains the pattern for a single integrated circuit, and the projected image from the photographic mask 315 is repeatedly stepped across the wafer after each exposure to successively expose multiple areas on the wafer with the same image.

Subsequent to exposure, the resist material may be selectively removed in a development operation as previously described to produce the desired pattern in the resist material. While in one embodiment the development takes place in a chamber (e.g., processing chamber 330), in other embodiments the development may take place in an open apparatus (not shown).

Subsequent to creating the pattern in the resist material, the ion source 320 directs at least one stream of ions onto the resist material on the wafer 301 to harden the resist material against a subsequent etch process as previously described. While in one embodiment a support device (not shown) is used to orient the wafer 301 in multiple positions with respect to the ion source 320 so that all exposed surfaces of the patterned resist material will be directly exposed to a stream of ions, alternate embodiments may use other techniques (e.g., the support device holds the wafer 301 stationary while the ion source 320 is moved to different positions, both wafer and ion source are moved, multiple ion sources are used, etc.)

Subsequent to the ion implantation process, the wafer 301 may be placed into processing chamber 330 to perform an etch operation. In the illustrated embodiment a plasma etch process is used, with electrodes 335 forming a plasma from the gaseous material in processing chamber 330, but other embodiments may use other etch processes. The etch process etches away portions of the underlying layer that are no longer covered by the resist layer. Because of the hardening effects of ion implantation, the remaining portions of the resist layer have increased resistance to the caustic effects of the etch process, and the underlying layer may be etched in a pattern that closely matches the pattern that was previously imparted into the resist layer.

The wafer 301 may be subjected to other processes that are performed before and/or during and/or after the processes described for system 300. Photolithographic device 310, ion source 320, and processing chamber 330 may or may not be used in various ones of these other processes.

The foregoing description is intended to be illustrative and not limiting. Variations will occur to those of skill in the art. Those variations are intended to be included in various embodiments of the invention, which are limited only by the spirit and scope of the appended claims.

What is claimed is:

1. A method, comprising:

producing a pattern in a layer of using deep ultraviolet lithography; and implanting the layer of resist material with ions in a dose sufficient to reduce damage to the resist material in a subsequent etch process;

wherein said producing the pattern in a layer of resist material includes producing the pattern in a layer of acrylic polymer.

2. The method of claim 1, wherein said producing the pattern in a layer of acrylic polymer includes producing the pattern in a layer of material containing at least one of acrylate; methacrylate; acrylate with a methyl group on backbone, and acrylate-methacrylate copolymer.

3. A method, comprising:

producing a pattern in a layer of resist material using deep ultraviolet lithography; and implanting the layer of resist material with ions in a dose sufficient to reduce damage to the resist material in a subsequent etch process;

wherein said implanting includes implanting the resist material with a dose within a range of about $5\times10^{14}$–$5\times10^{15}$ ions per cubic centimeter.

4. A method, comprising:

producing a pattern in a layer of resist material using deep ultraviolet lithography; and implanting the layer of resist material with ions in a dose sufficient to reduce damage to the resist material in a subsequent etch process;

wherein said implanting includes implanting the resist material with an ion energy in a range of about 10–25 kiloelectron volts.

5. A method, comprising:

producing a pattern in a layer of resist material using deep ultraviolet lithography; and implanting the layer of resist material with ions in a dose sufficient to reduce damage to the resist material in a subsequent etch process;

wherein said implanting includes implanting the resist material with at least one of silicon ions and fluorine ions.

6. The method of claim 5, wherein:

said implanting includes implanting the resist material with the ions produced from at least one of silicon tetrafluoride and boron trifluoride.

7. A method, comprising:

producing a pattern in a layer of resist material using deep ultraviolet lithography; and implanting the layer of resist material with ions in a dose sufficient to reduce damage to the resist material in a subsequent etch process;

wherein said implanting includes implanting the resist material with an ion stream at a substantially non-perpendicular angle to the layer of resist material.

8. The method of claim 7, further comprising:

performing the etch process on a first layer of material underlying the pattern of resist material.

9. The method of claim 8, further comprising:

removing the resist material from the first layer.

10. The method of claim 7, wherein:

said implanting at a substantially non-perpendicular angle includes directly implanting multiple sides of the resist material with the ion stream.

* * * * *